United States Patent
Lim et al.

(10) Patent No.: US 10,236,076 B2
(45) Date of Patent: Mar. 19, 2019

(54) METHODS AND APPARATUS FOR PREDICTABLE PROTOCOL AWARE TESTING ON MEMORY INTERFACE

(71) Applicant: Intel Corporation, Santa Clara, CA (US)

(72) Inventors: Wei Ming Lim, Bayan Lepas (MY); Madhu Rao, Scottsdale, AZ (US); Alvin Shing Chye Goh, Bayan Lepas (MY); Kim Leong Lee, Bayan Lepas (MY); Terrence Huat Hin Tan, Georgetown (MY); Vui Yong Liew, Bukit Mertajam (MY); Yah Chen Chew, sungai petani (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/282,574

(22) Filed: Sep. 30, 2016

(65) Prior Publication Data

US 2018/0096737 A1 Apr. 5, 2018

(51) Int. Cl.
*G06F 1/10* (2006.01)
*G11C 29/56* (2006.01)

(52) U.S. Cl.
CPC .......... *G11C 29/56004* (2013.01); *G06F 1/10* (2013.01); *G11C 2029/5602* (2013.01)

(58) Field of Classification Search
CPC .................................................... G11C 29/56

USPC .................................. 714/718, 711, 720, 722
See application file for complete search history.

(56) References Cited

U.S. PATENT DOCUMENTS

| | | | |
|---|---|---|---|
| 7,023,979 B1 * | 4/2006 | Wu ..................... | H04M 3/5233 379/265.11 |
| 7,676,034 B1 * | 3/2010 | Wu ..................... | H04M 3/5233 379/265.01 |
| 7,950,004 B2 * | 5/2011 | Vieira ................. | G06F 11/3688 714/25 |
| 8,352,651 B2 * | 1/2013 | Parfitt ................. | G05B 19/054 326/37 |
| 2010/0171654 A1 * | 7/2010 | Millard ................ | G01S 19/03 342/357.52 |

* cited by examiner

*Primary Examiner* — Fritz Alphonse
(74) *Attorney, Agent, or Firm* — Schwegman Lundberg & Woessner, P.A.

(57) ABSTRACT

Methods and apparatus for predictable protocol aware testing on a memory interface are are shown. An apparatus to support a protocol aware testing on a memory interface may include a digital controller to receive a plurality of read request commands from a unit under test. The digital controller further to hold the plurality of read request commands while a hold signal has a first value, and to sequentially release individual read request commands of the plurality of read request commands while to the hold signal has a second value. The digital controller further to provide input/output (I/O) commands to an output based on a particular released read request command of the plurality of read request commands. Timing of provision of the I/O commands is deterministic based on a transition of the hold signal from the first value to the second value.

15 Claims, 5 Drawing Sheets

METHODS AND APPARATUS FOR PREDICTABLE PROTOCOL AWARE TESTING ON MEMORY INTERFACE

BACKGROUND

A computer/processor unit that uses direct memory access (DMA) to a double data rate (DDR) interface may follow industry standard. DDR protocol and operate using deterministic clock-crossing designs along a propagation path from the unit under test to the DDR controller to the data storage and back. A tester (e.g., automatic test equipment ATE) testing the unit under test may adhere to the deterministic rules to communicate with devices along the propagation path to provide functional DDR read data pattern vectors in a deterministic manner across volume units, and covering all corners of process, variation, temperature (PVT). As functional operating clocks for the computer/processor units and the DDR continue to operate faster with each generation, complexity in guaranteeing deterministic timing relationships across PVT may become very complex and expensive.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Although the present disclosure uses elements of semiconductor chip packages, and their method of manufacture as an example, the disclosure is not so limited. Examples of the present disclosure may be used in any technology where formation of a solder ball in in a solder resist layer is controlled.

Figure 1:
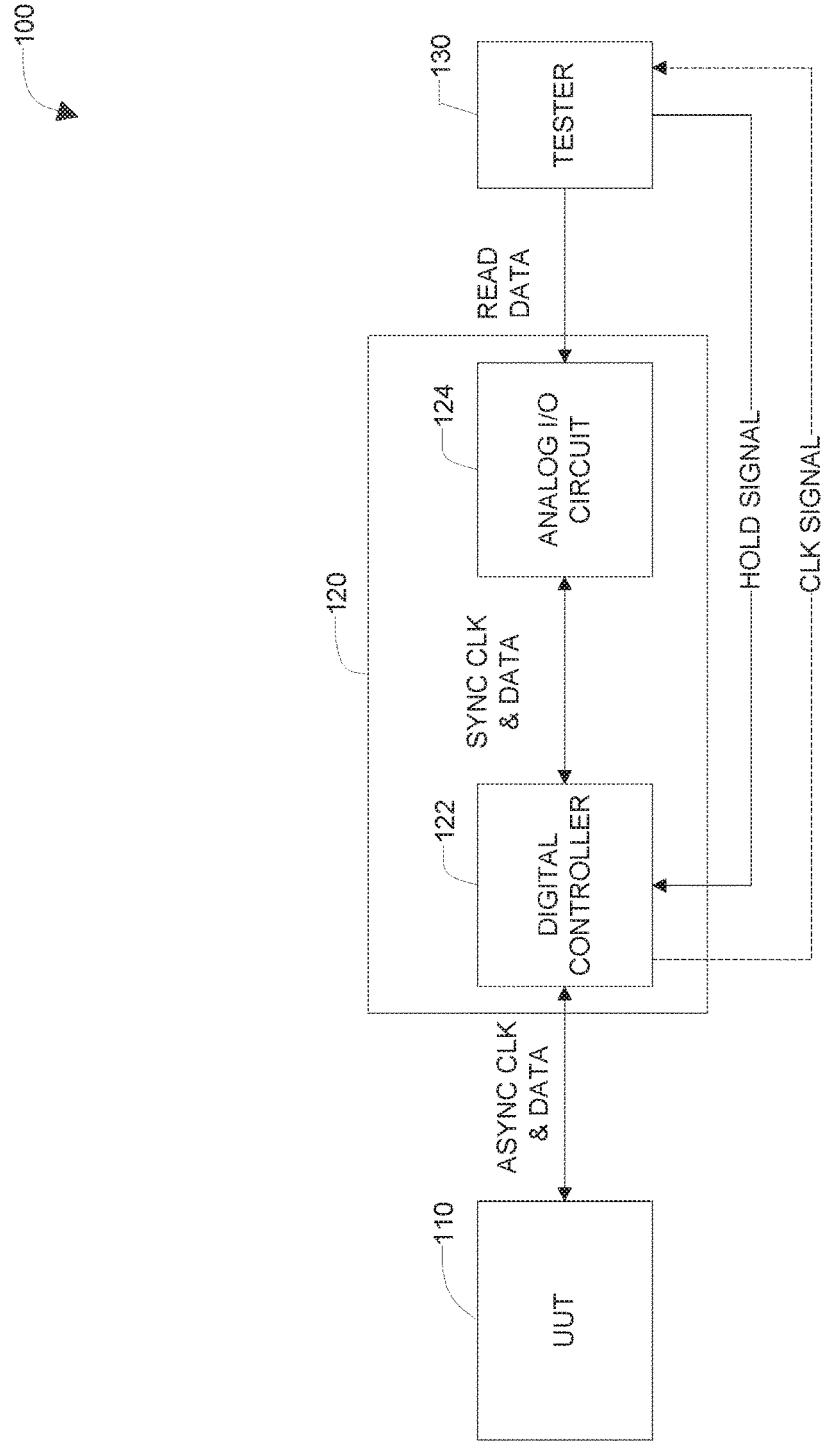
FIG. 1 depicts a testing system for deterministic protocol aware testing on a memory interface in accordance with embodiments of the disclosure.

FIG. 1 depicts a testing system 100 for deterministic protocol aware testing on a memory interface in accordance with embodiments of the disclosure. The system may include a unit under test (UUT) 110, a memory controller 120, and a tester 130. The UUT 110 may include any electronic device, circuit, package, system, etc., that performs DMA to DDR for data access. The UUT 110 may provide commands, data, controls signals, etc., (asynchronous data) to the memory controller 120 in response to an asynchronous clock, and may receive asynchronous data from the memory controller 120 in response to an asynchronous clock. That is, the clock of the UUT 110 is asynchronous with a clock of the memory controller 120.

The memory controller 120 may include a digital controller 122 and an analog input/output (I/O) circuit 124. In some examples, the memory controller 120 may be a DDR memory controller. The digital controller 122 may receive the asynchronous data in response to the asynchronous clock. The digital controller 122 may buffer the asynchronous data in a buffer, and may release the data based on a hold signal from the tester 130. In response to the hold signal, the digital controller 122 may provide synchronized data in response to a synchronized clock. The analog I/O circuit 124 may provide the synchronous data to an output. In normal operation, the output may be a memory, such as a DDR dynamic random-access memory (DRAM). The analog I/O circuit 124 may receive read data, and may provide the read data to the digital controller 122, which may provide the read data to the UUT 110. In some examples, the digital controller 122 may be a digital DDR controller. In some examples, the analog I/O circuit 124 may be an analog DDR I/O circuit.

The tester 130 may be coupled to the analog I/O circuit 124 and may include circuitry to provide the hold signal and read data to the analog I/O circuit 124. The read data may be provided based on timing of the hold signal. The tester 130 may include an automatic tester or automatic test equipment (ATE). In some examples, the tester 130 may also receive a clock signal CLK from the memory controller 120 to synchronize with transitions of the hold signal.

In operation, the tester 130 may perform tests on the UUT 110 to determine functionality (e.g., functional testing). Part of the testing of the UUT 110 may involve the UUT 110 interfacing with the memory controller 120 to retrieve data from memory to process. The UUT 110 may issue a request for data directed to target DDR space (e.g., memory, storage, etc.). The request may in the form of a read request command provided to the memory controller 120. The clock crossing between the UUT 110 and the memory controller 120 may be non-deterministic due to asynchronous clock and data designs. As a result, the read request command is provided from the UUT 110 is according to non-deterministic timing, and accordingly, the read request command provided from the memory controller 120 may also be non-deterministic. Because the read request command is non-deterministic, the tester 130 may not be capable of providing the read data in a deterministic manner using tester vector patterns.

Further, interfacing with the memory controller 120 may include meeting strict, high-volume manufacturing requirements. The high-volume manufacturing requirements requirements may include use of deterministic mechanisms, such as clock-cross determinism designs, universal clock sync alignment mechanisms, strict process variation timings, along an entire data path that involves traffic to and/or from the memory controller 120 to meeting timing requirements for DMA and DDR communication. Due to clock speeds becoming increasing higher, implementing the highly complex deterministic timing synchronization circuits is complex and expensive.

To mitigate the non-deterministic relationship between the UUT 110 and the memory controller 120, the digital controller 122 may include circuitry that allows the tester 130 to cause read request commands from the UUT 110 to be held at the digital controller 122, and allows the tester 130 to release the gated read request commands in a deterministic manner. For example, digital controller 122 may include a buffer to hold (e.g., store) read request commands received from the UUT 110. The tester 130 may use the hold signal to control timing of release of the held read request commands at the digital controller 122. For example, the tester 130 may assert the hold signal to hold read request commands. The tester 130 may deassert the hold signal to release a read request command. The tester 130 may reassert the hold signal after a predetermined period of time to limit a read request command to a single read request command. Thus, the hold signal may have an inverted pulse shape. The released read request command may flow through the digital controller 122 and the analog I/O circuit 124 normally. After a fixed delay, the analog I/O circuit 124 may open a receive enable window for receipt of the read data. The tester 130 may determine when the receive enable window will be open based on the fixed delay and the time of deassertion of the hold signal. The tester 130 may provide the read data within the calculated read enable window. The tester 130 may synchronize assertions and deassertions of the hold signal with the CLK signal from the digital controller 122. The tester 130 may repeat the process of releasing read request commands by deasserting the hold signal, and responding to the read request commands based on timing of deassertion of the hold signal. The tester 130 may also account for propagation delays associated with the hold signal, and the released read request command is it processes through the hold circuitry.

Figure 2:
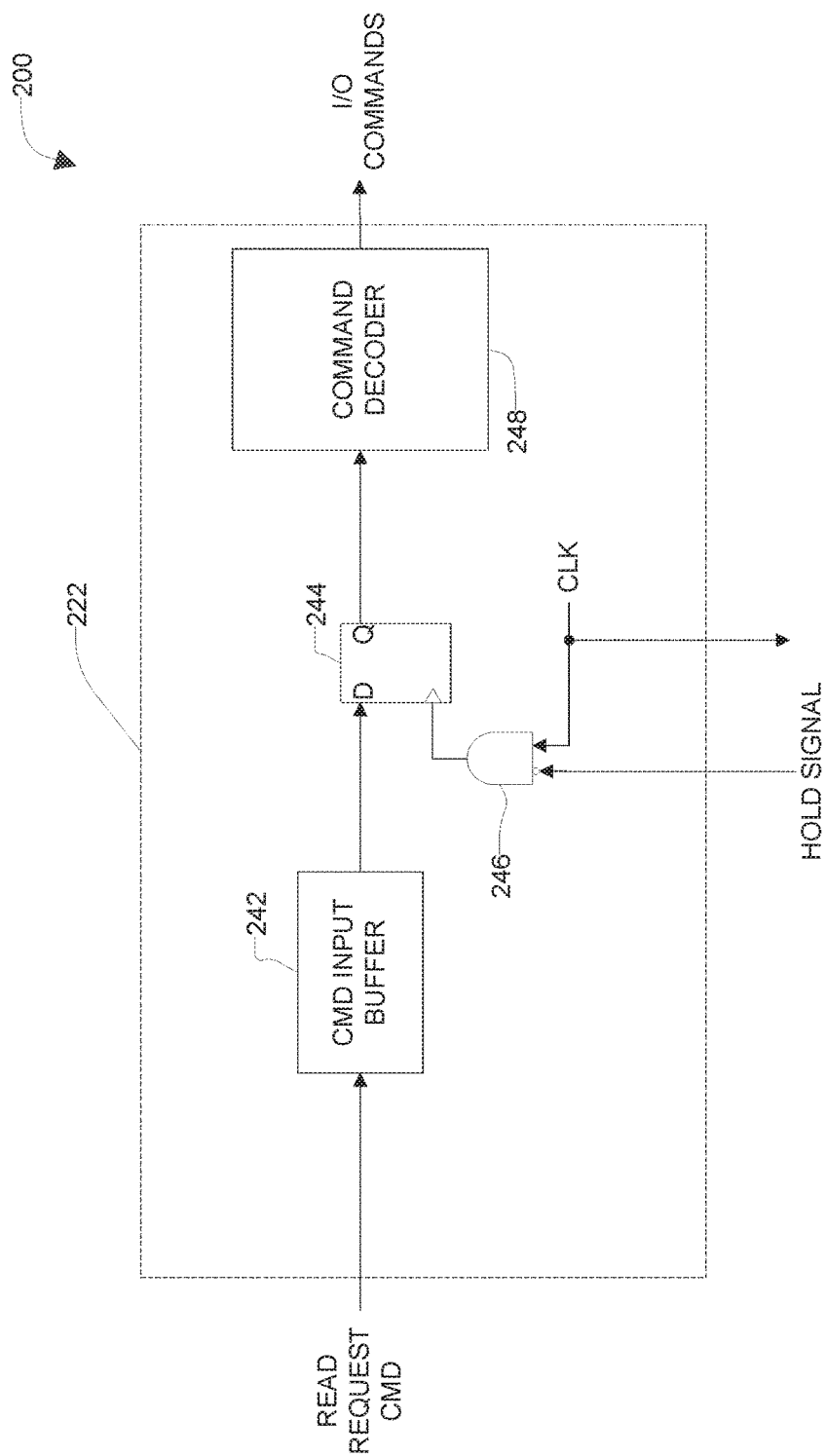
FIG. 2 depicts a testing system 200 for deterministic protocol aware testing on a memory interface in accordance with embodiments of the disclosure.

FIG. 2 depicts a testing system 200 for deterministic protocol aware testing on a memory interface in accordance with embodiments of the disclosure. The system may include a digital controller 222. The digital controller 222 may include a command input buffer 242, a flip-flop 244, a AND gate 246 and a command decoder 248. The digital controller 222 may be implemented in the digital controller 122 of FIG. 1. In some examples, the digital controller 222 may be a digital DDR controller.

The command input buffer 242 may store received read request commands. The received read request commands may be received from any electronic device, circuit, package, system, etc., that performs DMA to DDR for data access (e.g., and a unit under stest), such as the UUT 110 of FIG. 1. The flip-flop 244 may release read request commands from the command input buffer 242 in response to an output of the AND gate 246. The read request commands may be released from the command input buffer 242 on a first in, first out (FIFO) basis. In some examples, the flip-flop 244 may include multiple flip-flops that output respective bits of a read request command in parallel. In another example, the flip-flop 244 may include a single flip-flop that outputs the bits of the read request commands serially in response to multiple clock cycles of the clock signal CLK. In yet another example, the flip-flop 244 may include multiple flip-flops that outputs respective bits of the read request commands both in parallel and serially in response to multiple clock cycles of the clock signal CLK. The flip-flop 244 may be controlled based on an output of the AND gate 246. The output of the AND gate 246 may controlled by an inverted hold signal and the CLK signal. The command decoder 248 may process the read command and provide I/O commands to an output according to timing of the CLK signal. The command decoder 248 may operate according to industry standard DDR timing requirements. The I/O commands may be provided to a DDR analog I/O circuit, such as the analog I/O circuit 124 of FIG. 1.

In operation, the command input buffer 242 may receive the read request commands. The timing of the read request commands may be asynchronous with timing of the CLK signal. The command input buffer 242 may provide the read request commands to the flip-flop 244. The flip-flop 244 may be clocked in response to an output of the AND gate 246. The AND gate 246 may operate in response to the CLK signal, which is an internal clock signal of the digital controller 222, and the inverted hold signal. The hold signal may be a test signal provided by a tester, such as the tester 130 of FIG. 1. While the hold signal is deasserted by the tester (e.g., and the inverted hold signal is asserted), the output of the AND gate 246 may be equal to the CLK signal, which may clock the flip-flop 244 to propagate the read request commands to the command decoder 248. While the hold signal is asserted by the tester (e.g., and the inverted hold signal is deasserted), the output of the AND gate 246 may be equal to a logical low value. While the output of the flip-flop 244 has a logical low value, the read request commands may be held at the command input buffer 242. During testing, the hold signal may be deasserted for a time period equal to an amount of time required for the flip-flop 244 to provide a single read request command to the command decoder 248, in some examples. The CLK signal may be provided at an output to the tester, and in some examples, the timing of the transitions of the hold signal may be synchronized (e.g., aligned) with a rising or falling edge of the CLK signal.

The command decoder 248 may operate according to industry standard DDR timing requirements to provide the I/O commands deterministically. It is understood that the digital controller 222 may include additional components to perform other DDR operations, such as processing write requests, processing data received from the unit under test or a storage device, power circuits, etc. It is further understood that the command input buffer 242, the flip-flop 244, and the AND gate 246 represent one logical combination for controlling timing of release of the read request commands. Other logical combinations may be implemented to achieve similar functionality.

Figure 3:
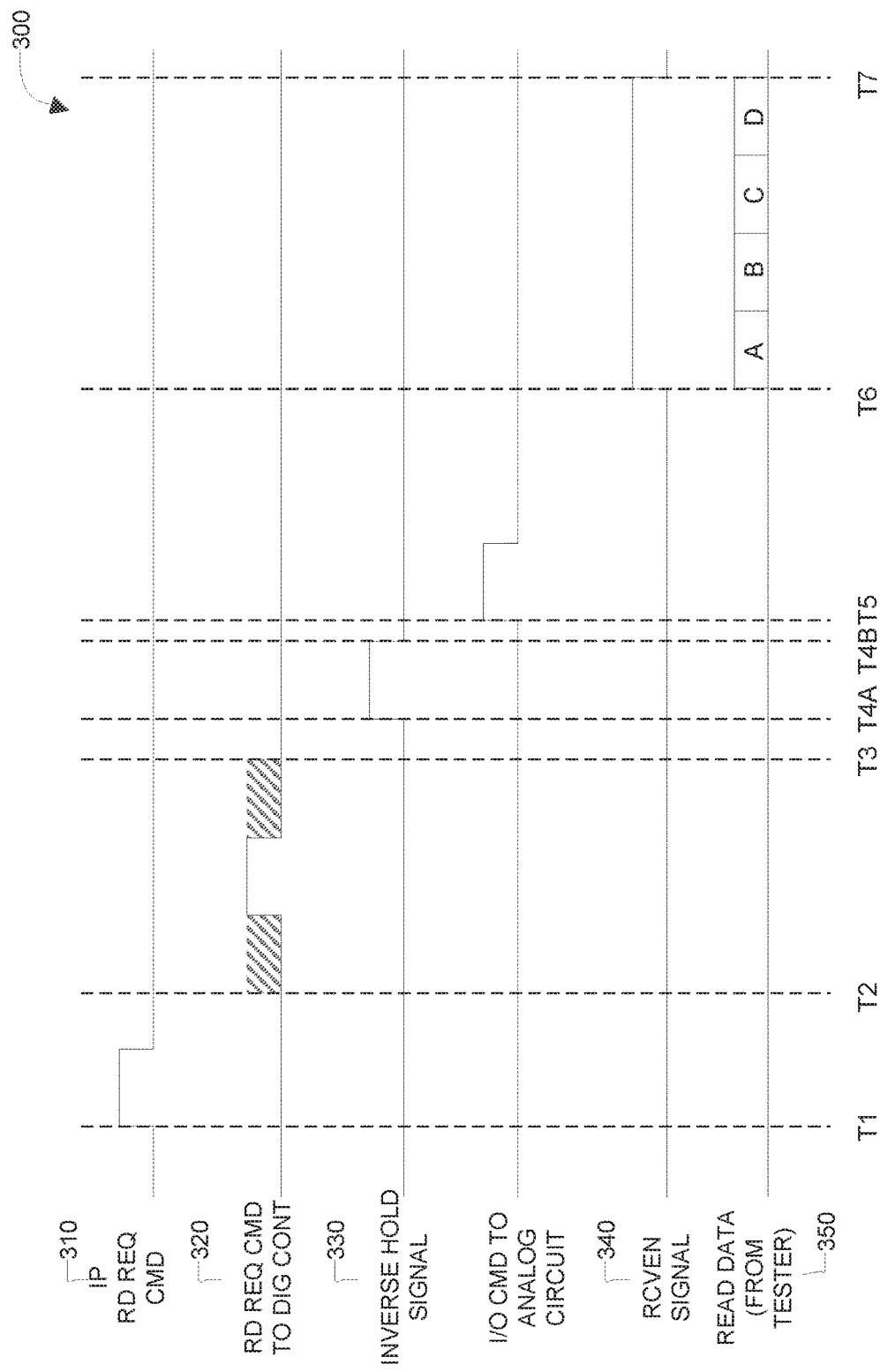
FIG. 3 depicts an exemplary timing diagram 300 for deterministic protocol aware testing on a memory interface according in accordance with embodiments of the disclosure.

FIG. 3 depicts an exemplary timing diagram 300 for deterministic protocol aware testing on a memory interface according in accordance with embodiments of the disclosure. For example, the exemplary timing diagram 300 may illustrate timing characteristics of the system 100 of FIG. 1, the system 200 of FIG. 2, or combinations thereof. In a particular embodiment, the exemplary timing diagram 300 illustrates propagation of a read request command through a DDR memory controller and receipt of corresponding read data.

At time T1, a read request command 310 may be generated. The read request command 310 may be generated by a unit under test, such as any electronic device, circuit, package, system, etc., that performs DMA to DDR for data access. The unit under test may include the UUT 110 of FIG. 1. Sometime between times T2 and T3, the unit under test may provide a read request command 320 to a digital controller, such as the digital controller 122 of FIG. 1 or the digital controller 222 of FIG. 2. The timing of the provision between T2 and T3 may be non-deterministic. The read request command 320 may be held in the DDR digital controller (e.g., in a buffer, such as the command input buffer 242 of FIG. 2).

Between time T4A and T4B, an inverted hold signal 330 may be asserted. The inverted hold signal 330 may include the hold signal of FIG. 1 or the hold signal of FIG. 2. The inverted hold signal 330 may be asserted by a tester, such as the tester 130 of FIG. 1. The length of the assertion of the inverted hold signal 330 between times T4A and T4B may allow the release of a single read request command from the buffer of the digital controller. At time T5, the DDR digital controller may send I/O commands to an analog I/O circuit, such as the analog I/O circuit 124 of FIG. 1. Starting at time T6, and ending at T7, the analog I/O circuit may set a receive enable (RCVEN) signal 340 providing a window to receive read data associated with the read request command. Between time T6 and T7, the read data A, B, C, and D READ DATA 350 may be provided to the DDR analog I/O circuit by the tester. The timing between T4A and T6 may be a deterministic time based on the fixed read request command latency defined in the standard industry DDR protocol. Therefore, despite the read request command 320 being non-deterministic, using the inverted hold signal 330 to control release of the read request command 320 in the DDR digital controller may provide a method to make the RCVEN window RCVEN signal 340 deterministic. The depiction of a magnitude of the signals, and a relative timing of the signals represented in the exemplary timing diagram 300 is not intended to be to scale.

Figure 4:
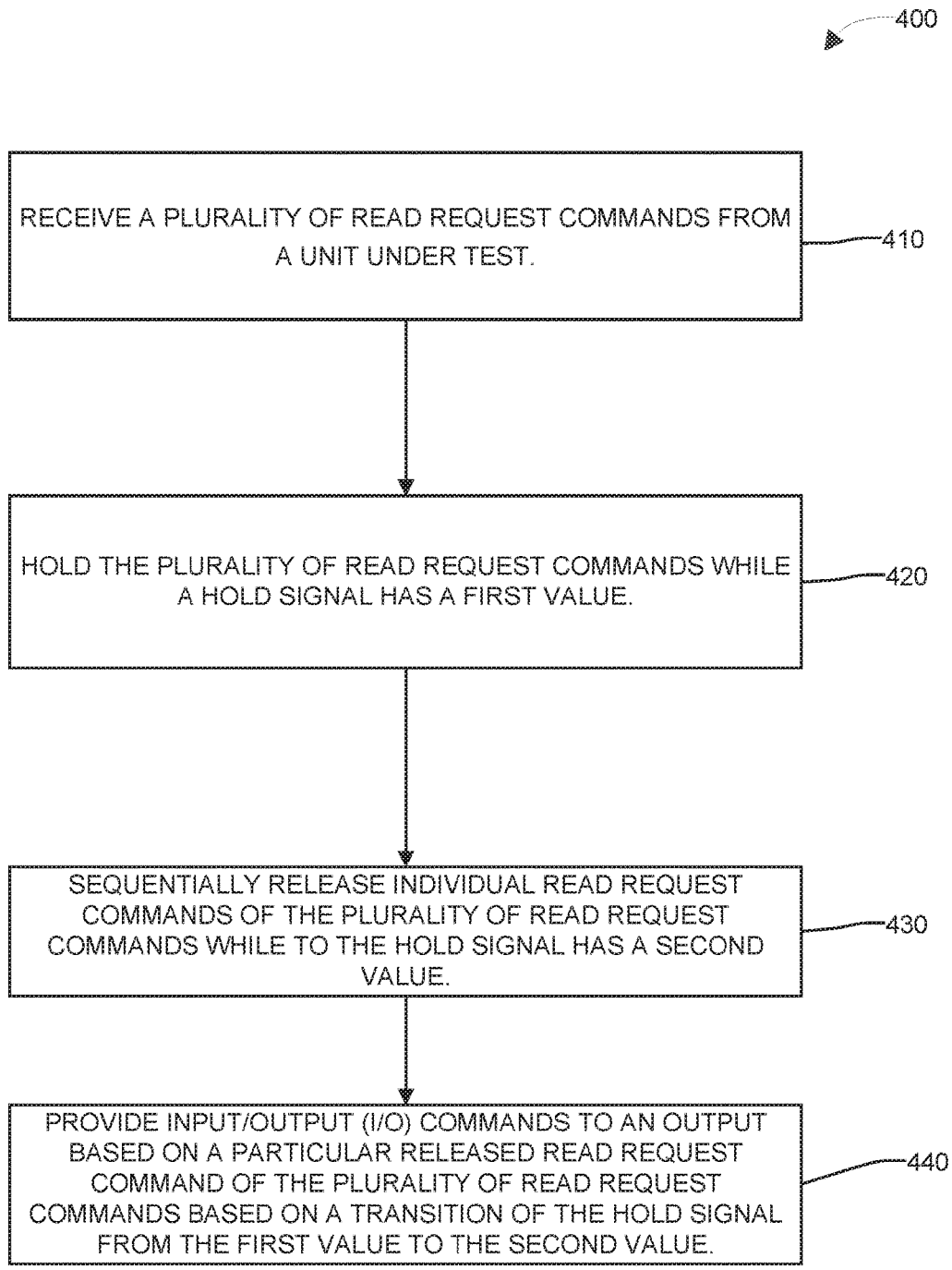
FIG. 4 illustrates a method 400 for deterministic protocol aware testing on a memory interface in accordance with some embodiments of the disclosure.

FIG. 4 illustrates a method 400 for deterministic protocol aware testing on a memory interface in accordance with some embodiments of the disclosure. The method 400 may be implemented the memory controller 120 of FIG. 1, the digital controller 222 of FIG. 2, or combinations thereof.

The method 400 may include receiving a plurality of read request commands from a unit under test, at 410.

The method 400 may further include holding the plurality of read request commands while a hold signal has a first value, at 420. In some examples, holding the plurality of read request commands may include storing the plurality of read request commands in a buffer, such as the command input buffer 242 of FIG. 2.

The method 400 may further include sequentially releasing individual read request commands of the plurality of read request commands while to the hold signal has a second value, at 430. In some examples, sequentially releasing the individual read request commands of the plurality of read request commands while to the hold signal has a second value may include propagating the individual read request commands to an output of a flip-flop, such as the flip-flop 244 of FIG. 2, in response to a clock signal while the hold signal has the second value. The transitions of the hold signal to the first value and to the second value may be synchronized with a rising or falling edge of the clock signal. In some examples, a length of time the hold signal is set to the second value may be based on a length of time to propagate one read request command of the plurality of the read request commands to the output of the flip-flop. In some examples, the method 400 may further include decoding the particular released read request command to provide the I/O commands.

The method 400 may further include providing input/output (I/O) commands to an output based on a particular released read request command of the plurality of read request commands, at 440. In some examples, timing of provision of the I/O commands may be deterministic based on a transition of the hold signal from the first value to the second value.

In some examples, the method 400 may further include enabling receipt of read data for a window of time associated with the particular released read request command based on the I/O commands. A start time and an end time associated with the window of time may be deterministic based on the transition of the hold signal to the second value.

Figure 5:
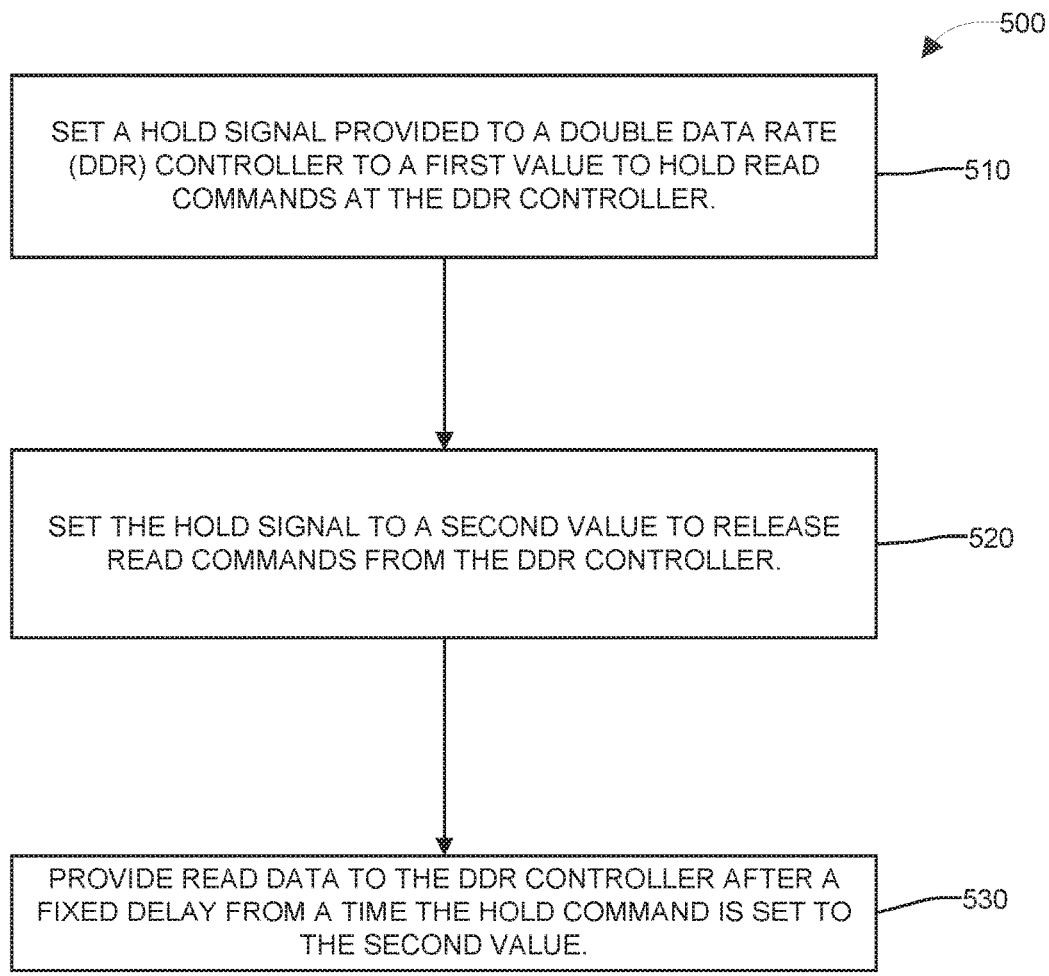
FIG. 5 illustrates a method 500 for deterministic protocol aware testing on a memory interface in accordance with some embodiments of the disclosure.

FIG. 5 illustrates a method 500 for deterministic protocol aware testing on a memory interface in accordance with some embodiments of the disclosure. The method 500 may be implemented the tester 130 of FIG. 1.

The method 500 may include setting a hold signal provided to a double data rate (DDR) controller to a first value to hold read commands at the DDR controller, at 510. The DDR controller may include the memory controller 120 of FIG. 1, the digital controller 222 of FIG. 2 or combinations thereof. The method 500 may further include setting the hold signal to a second value to release read commands from the DDR controller, at 520. In some examples, the method 500 may further include receiving a clock signal from the DDR controller. Time transitions of the hold signal to the first value and the second value align with either a rising or falling edge of the clock signal, in some examples.

The method 500 may further include providing read data to the DDR controller after a fixed delay from a time the hold command is set to the second value, at 530. The method 500 may further include after a second fixed delay measured from setting the hold signal to the second value, setting the hold signal back to the first value. The second fixed delay may be equal to a length of time to release a single read command at the DDR controller. In some examples, the method 500 may further include accounting for propagation time of the hold signal to the DDR controller in the fixed delay.

To better illustrate the methods and device disclosed herein, a non-limiting list of embodiments is provided here:

Example 1 is an apparatus to support a protocol aware testing on a memory interface, the apparatus comprising: a digital controller to receive a plurality of read request commands from a unit under test, the digital controller further to hold the plurality of read request commands while a hold signal has a first value, the digital controller further to sequentially release individual read request commands of the plurality of read request commands while to the hold signal has a second value, the digital controller further to provide input/output (I/O) commands to an output based on a particular released read request command of the plurality of read request commands, wherein timing of provision of the I/O commands is deterministic based on a transition of the hold signal from the first value to the second value.

In Example 2, the subject matter of Example 1 optionally includes wherein the digital controller includes a buffer to hold the plurality of read request commands.

In Example 3, the subject matter of any one or more of Examples 1-2 optionally include wherein the digital controller includes circuitry to receive the hold signal, and to sequentially release the individual read request commands of the plurality of read request commands in response to the hold signal.

In Example 4, the subject matter of Example 3 optionally includes wherein the circuitry include a flip-flop to sequentially receive individual read request commands of the plurality of read request commands at an input and to propagate the individual read request commands to an output of the flip-flop in response to a clock signal while the hold signal has the second value.

In Example 5, the subject matter of Example 4 optionally includes wherein the circuitry include an AND logic gate to receive an inverted hold signal and the clock signal, the AND gate to provide an output signal to the flip-flop a flip-flop based on the inverted hold signal and the clock signal.

In Example 6, the subject matter of any one or more of Examples 4-5 optionally include wherein transitions of the hold signal to the first value and to the second value are aligned with a rising or falling edge of the clock signal.

In Example 7, the subject matter of any one or more of Examples 4-6 optionally include wherein a length of time the hold signal is set to the second value may be based on a length of time to propagate one read request command of the plurality of the read request commands to the output of the flip-flop.

In Example 8, the subject matter of any one or more of Examples 1-7 optionally include an analog I/O circuit to receive the I/O commands, the analog I/O circuit further to enable receipt of read data for a window of time associated with the particular released read request command based on the I/O commands, wherein a start time and an end time associated with the window of time is deterministic based on the transition of the hold signal to the second value.

In Example 9, the subject matter of any one or more of Examples 1-8 optionally include wherein the digital controller includes a command decoder to receive the particular released read request command and to decode the particular released read request command to provide the I/O commands.

In Example 10, the subject matter of any one or more of Examples 1-9 optionally include wherein the digital controller is a double data rate (DDR) digital controller.

In Example 11, the subject matter of any one or more of Examples 1-10 optionally include wherein to receive the plurality of read request commands from a unit under test includes the digital controller to receive the plurality of read request commands asynchronously.

Example 12 is an apparatus to support a protocol aware testing on a memory interface, the apparatus comprising: a tester to interface with a double data rate (DDR) controller to provide read data to a unit under test, the tester to provide a hold signal to the DDR controller, the tester to set the hold signal to a first value to hold read commands at the DDR controller, the tester to set the hold signal to a second value to release read commands from the DDR controller, the tester to provide read data to the DDR controller after a fixed delay from a time the hold command is set to the second value.

In Example 13, the subject matter of Example 12 optionally includes wherein after a second fixed delay a time the tester set the hold signal to the second value, the tester to set the hold signal back to the first value.

In Example 14, the subject matter of Example 13 optionally includes wherein the second fixed delay is equal to a length of time to release a single read command at the DDR controller.

In Example 15, the subject matter of any one or more of Examples 12-14 optionally include wherein the tester to receive a clock signal from the DDR controller, wherein the tester to time transitions of the hold signal to the first value and to the second value to align with either a rising or falling edge of the clock signal.

In Example 16, the subject matter of Example 15 optionally includes wherein the tester to account for propagation time of the hold signal to the DDR controller in the fixed delay.

Example 17 is a method to support a protocol aware testing on a memory interface, the method comprising: receiving a plurality of read request commands from a unit under test; holding the plurality of read request commands while a hold signal has a first value; sequentially releasing individual read request commands of the plurality of read request commands while to the hold signal has a second value; and providing input/output (I/O) commands to an output based on a particular released read request command of the plurality of read request commands, wherein timing of provision of the I/O commands is deterministic based on a transition of the hold signal from the first value to the second value.

In Example 18, the subject matter of Example 17 optionally includes wherein holding the plurality of read request commands while the hold signal has the first value includes storing the plurality of read request commands in a buffer.

In Example 19, the subject matter of any one or more of Examples 17-18 optionally include wherein sequentially releasing the individual read request commands of the plurality of read request commands while to the hold signal has a second value includes propagating the individual read request commands to an output of a flip-flop in response to a clock signal while the hold signal has the second value.

In Example 20, the subject matter of Example 19 optionally includes wherein transitions of the hold signal to the first value and to the second value are aligned with a rising or falling edge of the clock signal.

In Example 21, the subject matter of any one or more of Examples 19-20 optionally include wherein a length of time the hold signal is set to the second value may be based on a length of time to propagate one read request command of the plurality of the read request commands to the output of the flip-flop.

In Example 22, the subject matter of any one or more of Examples 17-21 optionally include enabling receipt of read data for a window of time associated with the particular released read request command based on the I/O commands, wherein a start time and an end time associated with the window of time is deterministic based on the transition of the hold signal to the second value.

In Example 23, the subject matter of any one or more of Examples 17-22 optionally include decoding the particular released read request command to provide the I/O commands.

Example 24 is at least one medium including instructions that, when executed on a machine cause the machine to perform any of the methods of Examples 17-23.

Example 25 is an apparatus comprising means for performing any of the methods of Examples 17-23.

Example 26 is an method to support a protocol aware testing on a memory interface, the method comprising: setting a hold signal provided to a double data rate (DDR) controller to a first value to hold read commands at the DDR controller; setting the hold signal to a second value to release read commands from the DDR controller; and providing read data to the DDR controller after a fixed delay from a time the hold command is set to the second value.

In Example 27, the subject matter of Example 26 optionally includes after a second fixed delay measured from setting the hold signal to the second value, setting the hold signal back to the first value.

In Example 28, the subject matter of Example 27 optionally includes wherein the second fixed delay is equal to a length of time to release a single read command at the DDR controller.

In Example 29, the subject matter of any one or more of Examples 26-28 optionally include receiving a clock signal from the DDR controller, wherein time transitions of the hold signal to the first value and the second value align with either a rising or falling edge of the clock signal.

In Example 30, the subject matter of Example 29 optionally includes accounting for propagation time of the hold signal to the DDR controller in the fixed delay.

Example 31 is at least one medium including instructions that, when executed on a machine cause the machine to perform any of the methods of Examples 26-30.

Example 32 is an apparatus comprising means for performing any of the methods of Examples 26-30.

Example 33 is an apparatus to support a protocol aware testing on a memory interface, the apparatus comprising: means for receiving a plurality of read request commands from a unit under test; means for holding the plurality of read request commands while a hold signal has a first value; means for sequentially releasing individual read request commands of the plurality of read request commands while to the hold signal has a second value; and means for providing input/output (I/O) commands to an output based on a particular released read request command of the plurality of read request commands, wherein timing of provision of the I/O commands is deterministic based on a transition of the hold signal from the first value to the second value.

In Example 34, the subject matter of Example 33 optionally includes wherein means for holding the plurality of read request commands while the hold signal has the first value includes means for storing the plurality of read request commands in a buffer.

In Example 35, the subject matter of any one or more of Examples 33-34 optionally include wherein means for sequentially releasing the individual read request commands of the plurality of read request commands while to the hold signal has a second value includes means for propagating the individual read request commands to an output of a flip-flop in response to a clock signal while the hold signal has the second value.

In Example 36, the subject matter of Example 35 optionally includes wherein transitions of the hold signal to the first value and to the second value are aligned with a rising or falling edge of the clock signal.

In Example 37, the subject matter of any one or more of Examples 35-36 optionally include wherein a length of time the hold signal is set to the second value may be based on a length of time to propagate one read request command of the plurality of the read request commands to the output of the flip-flop.

In Example 38, the subject matter of any one or more of Examples 33-37 optionally include means for enabling receipt of read data for a window of time associated with the particular released read request command based on the I/O commands, wherein a start time and an end time associated with the window of time is deterministic based on the transition of the hold signal to the second value.

In Example 39, the subject matter of any one or more of Examples 33-38 optionally include means for decoding the particular released read request command to provide the I/O commands.

Example 40 is an apparatus to support a protocol aware testing on a memory interface, the apparatus comprising: means for setting a hold signal provided to a double data rate (DDR) controller to a first value to hold read commands at the DDR controller; means for setting the hold signal to a second value to release read commands from the DDR controller; and means for providing read data to the DDR controller after a fixed delay from a time the hold command is set to the second value.

In Example 41, the subject matter of Example 40 optionally includes means for, after a second fixed delay measured from setting the hold signal to the second value, setting the hold signal back to the first value.

In Example 42, the subject matter of Example 41 optionally includes wherein the second fixed delay is equal to a length of time to release a single read command at the DDR controller.

In Example 43, the subject matter of any one or more of Examples 40-42 optionally include means for receiving a clock signal from the DDR controller, wherein time transitions of the hold signal to the first value and the second value align with either a rising or falling edge of the clock signal.

In Example 44, the subject matter of Example 43 optionally includes means for accounting for propagation time of the hold signal to the DDR controller in the fixed delay.

The above detailed description includes references to the accompanying drawings, which form a part of the detailed description. The drawings show, by way of illustration, specific embodiments in which the disclosure can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the disclosure should be determined with reference to the appended claims, along with the full scope of equivalents to which such claims are entitled.

What is claimed is:

1. An apparatus to support a protocol aware testing on a memory interface, the apparatus comprising:

a testing device, including circuitry to generate a hold signal;
a digital controller to receive a plurality of read request commands from a unit under test, the digital controller further to hold the plurality of read request commands while the hold signal has a first value, the digital controller further to sequentially release individual read request commands of the plurality of read request commands while the hold signal has a second value;
the digital controller including circuitry that includes an AND gate coupled to both the hold signal and an internal clock (CLK) signal such that the read request is timed with the CLK signal;
the digital controller further to provide input/output (I/O) commands to an output based on a particular released read request command of the plurality of read request commands, wherein timing of provision of the I/O commands is deterministic based on a transition of the hold signal from the first value to the second value.

2. The apparatus of claim 1, wherein the digital controller includes a buffer to hold the plurality of read request commands.

3. The apparatus of claim 1, wherein the circuitry include a flip-flop to sequentially receive individual read request commands of the plurality of read request commands at an input and to propagate the individual read request commands to an output of the flip-flop in response to a clock signal while the hold signal has the second value.

4. The apparatus of claim 3, wherein a length of me the hold signal is set to the second value is a length of time to propagate one read request command of the plurality of the read request commands to the output of the flip-flop.

5. The apparatus of claim 1, further comprising an analog I/O circuit to re I/O commands, the analog I/O circuit further to enable receipt of read data for a window of time associated with the particular released read request command based on the I/O commands, wherein a start time and an end time associated with the window of time is deterministic based on the transition of the hold signal to the second value.

6. The apparatus of claim 1, wherein the digital controller includes a command decoder to receive the particular released read request command and to decode the particular released read request command to provide the I/O commands.

7. The apparatus of claim 1, wherein the digital controller is a double data rate (DDR) digital controller.

8. The apparatus of claim 1, wherein to receive the plurality of read request commands from a unit under test includes the digital controller to receive the plurality of read request commands asynchronously.

9. An apparatus to support a protocol aware testing on a memory interface, the apparatus comprising:

a tester to interface with a double data rate (DDR) controller to provide read data to a unit under test, the tester to provide a hold signal to the DDR controller, the tester to set the hold signal to a first value to hold read commands at the DDR controller, the tester to set the hold signal to a second value to release read commands from the DDR controller;
the DDR controller including circuitry that includes an AND gate coupled to both the hold signal and an internal clock (CLK) signal such that the read commands are timed with the CLK signal;
the tester to provide read data to the DDR controller after a fixed delay from a time the hold command is set to the second value.

10. The apparatus of claim 9, wherein after a second fixed delay a time the tester set the hold signal to the second value, the tester to set the hold signal back to the first value.

11. The apparatus of claim 10, wherein the second fixed delay is equal to a length of time to release a single read command at the DR controller.

12. The apparatus of claim 9, wherein the tester to receive a clock signal from the DDR controller, wherein the tester to time transitions of the hold signal to the first value and to the second value to align with either a rising or falling edge of the clock signal.

13. The apparatus of claim 12, wherein the tester to account for propagation ti the hold signal to the DDR controller in the fixed delay.

14. A method to support a protocol aware testing on a memory interface, the method comprising:
receiving a plurality of read request commands from a unit under test;
holding the plurality of read request commands while a hold signal has a first value;
sequentially releasing individual read request commands of the plurality of read request commands while the hold signal has a second value as a result of actuating an AND gate based on inputs from both the hold signal and an internal clock (CLK) signal; and
providing input/output (I/O) commands to an output based on a particular released read request command of the plurality of read request commands, wherein timing of provision of the I/O commands is deterministic based on a transition of the hold signal from the first value to the second value.

15. The method of claim 14, wherein holding the plurality of read request commands while the hold signal has the first value includes storing die plurality of read request commands in a buffer.

* * * * *